United States Patent
Kim et al.

(10) Patent No.: US 9,337,381 B2
(45) Date of Patent: May 10, 2016

(54) SEMICONDUCTOR BUFFER STRUCTURE, SEMICONDUCTOR DEVICE INCLUDING THE SEMICONDUCTOR BUFFER STRUCTURE, AND METHOD OF MANUFACTURING THE SEMICONDUCTOR DEVICE USING THE SEMICONDUCTOR BUFFER STRUCTURE

(71) Applicants: Jun-youn Kim, Hwaseong-si (KR); Young-jo Tak, Hwaseong-si (KR); Jae-kyun Kim, Hwaseong-si (KR); Joo-sung Kim, Seongnam-si (KR); Young-soo Park, Yongin-si (KR); Su-hee Chae, Suwon-si (KR)

(72) Inventors: Jun-youn Kim, Hwaseong-si (KR); Young-jo Tak, Hwaseong-si (KR); Jae-kyun Kim, Hwaseong-si (KR); Joo-sung Kim, Seongnam-si (KR); Young-soo Park, Yongin-si (KR); Su-hee Chae, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/484,456

(22) Filed: Sep. 12, 2014

(65) Prior Publication Data
US 2015/0111369 A1 Apr. 23, 2015

(30) Foreign Application Priority Data

Oct. 21, 2013 (KR) .................. 10-2013-0125542

(51) Int. Cl.
*H01L 21/00* (2006.01)
*H01L 33/00* (2010.01)
(Continued)

(52) U.S. Cl.
CPC ........ *H01L 33/0025* (2013.01); *H01L 21/0254* (2013.01); *H01L 21/02381* (2013.01);
(Continued)

(58) Field of Classification Search
CPC .............. H01L 21/0254; H01L 21/02458; H01L 21/02381; H01L 21/02507; H01L 21/02642; H01L 21/02505; H01L 21/02389; H01L 33/007; H01L 33/0075; H01L 33/12; H01L 33/0025
USPC .................. 438/478, 47, 46; 257/190, 17, 18
See application file for complete search history.

(56) References Cited

U.S. PATENT DOCUMENTS 6,372,608 B1   4/2002   Shimoda et al.
6,617,060 B2   9/2003   Weeks, Jr. et al.
(Continued)

FOREIGN PATENT DOCUMENTS

EP   2 554 719 A1   2/2013
JP   11-040850 A    2/1999
(Continued)

OTHER PUBLICATIONS

H. Amano, "Control of Dislocations and Stress in Algan on Sapphire Using a Low Temperature Interlayer", Received Jul. 4, 1999, 7pgs, phys. stat. sol. (b) 216, 683 (1999) Subject classification: 68.55.Jk; S7.14; S7.15, Japan.

(Continued)

*Primary Examiner* — Michael Trinh
(74) *Attorney, Agent, or Firm* — Harness, Dickey & Pierce, P.L.C.

(57) ABSTRACT

A semiconductor buffer structure includes a silicon substrate, a nucleation layer formed on the silicon substrate, and a buffer layer formed on the nucleation layer. The buffer layer includes a first layer formed of a nitride semiconductor material having a uniform composition rate, a second layer formed of the same material as the nucleation layer on the first layer, and a third layer formed of the same material with the same composition ratio as the first layer on the second layer.

19 Claims, 14 Drawing Sheets

(51) Int. Cl.
*H01L 33/12* (2010.01)
*H01L 21/02* (2006.01)
*H01L 33/32* (2010.01)

(52) U.S. Cl.
CPC .... *H01L21/02433* (2013.01); *H01L 21/02458* (2013.01); *H01L 21/02505* (2013.01); *H01L 33/12* (2013.01); *H01L 33/007* (2013.01); *H01L 33/0079* (2013.01); *H01L 33/32* (2013.01)

(56) References Cited

U.S. PATENT DOCUMENTS

| | | | |
|---|---|---|---|
| 6,645,830 | B2 | 11/2003 | Shimoda et al. |
| 6,649,287 | B2 | 11/2003 | Weeks, Jr. et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,956,250 | B2 | 10/2005 | Borges et al. |
| 6,967,353 | B2 | 11/2005 | Suzuki et al. |
| 6,975,703 | B2 | 12/2005 | Wilson et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,154,124 | B2 | 12/2006 | Han et al. |
| 7,208,725 | B2 | 4/2007 | Sherrer et al. |
| 7,288,758 | B2 | 10/2007 | Sherrer et al. |
| 7,319,044 | B2 | 1/2008 | Han et al. |
| 7,501,656 | B2 | 3/2009 | Han et al. |
| 7,598,108 | B2 * | 10/2009 | Li et al. .......... 438/48 |
| 7,611,917 | B2 | 11/2009 | Emerson et al. |
| 7,612,361 | B2 | 11/2009 | Park et al. |
| 7,655,090 | B2 | 2/2010 | Marchand et al. |
| 7,687,888 | B2 | 3/2010 | Marchand et al. |
| 7,709,857 | B2 | 5/2010 | Kim et al. |
| 7,759,140 | B2 | 7/2010 | Lee et al. |
| 7,781,727 | B2 | 8/2010 | Sherrer et al. |
| 7,790,482 | B2 | 9/2010 | Han et al. |
| 7,816,764 | B2 | 10/2010 | Marchand et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,352 | B2 | 9/2011 | Lee et al. |
| 8,049,161 | B2 | 11/2011 | Sherrer et al. |
| 8,105,921 | B2 | 1/2012 | Weeks, Jr. et al. |
| 8,129,711 | B2 | 3/2012 | Kang et al. |
| 8,179,938 | B2 | 5/2012 | Kim |
| 8,263,987 | B2 | 9/2012 | Choi et al. |
| 8,324,646 | B2 | 12/2012 | Lee et al. |
| 8,362,503 | B2 | 1/2013 | Saxler et al. |
| 8,399,944 | B2 | 3/2013 | Kwak et al. |
| 8,432,511 | B2 | 4/2013 | Jeong |
| 8,459,832 | B2 | 6/2013 | Kim |
| 8,502,242 | B2 | 8/2013 | Kim |
| 8,536,604 | B2 | 9/2013 | Kwak et al. |
| 8,624,220 | B2 | 1/2014 | Horie et al. |
| 8,735,931 | B2 | 5/2014 | Han et al. |
| 8,766,295 | B2 | 7/2014 | Kim |
| 8,772,758 | B2 | 7/2014 | Hardy et al. |
| 8,778,783 | B2 | 7/2014 | Melnik et al. |
| 2005/0110043 | A1 | 5/2005 | Otsuka et al. |
| 2006/0154455 | A1 | 7/2006 | Guo et al. |
| 2008/0217645 | A1 | 9/2008 | Saxler et al. |
| 2010/0117118 | A1 | 5/2010 | Dabiran et al. |
| 2010/0237387 | A1 * | 9/2010 | Sato .............. 257/190 |
| 2011/0253974 | A1 | 10/2011 | Horie et al. |
| 2012/0074385 | A1 * | 3/2012 | Tak et al. .......... 257/15 |
| 2012/0129290 | A1 | 5/2012 | Lin |
| 2012/0168753 | A1 | 7/2012 | Sanga |
| 2012/0286241 | A1 | 11/2012 | Hardy et al. |
| 2012/0295418 | A1 | 11/2012 | Melnik et al. |
| 2012/0300168 | A1 | 11/2012 | Hoke |
| 2013/0026480 | A1 | 1/2013 | Fenwick et al. |
| 2013/0037857 | A1 | 2/2013 | Von Kanel et al. |
| 2013/0065342 | A1 | 3/2013 | Stauss et al. |
| 2013/0140567 | A1 | 6/2013 | Kim et al. |
| 2013/0175541 | A1 | 7/2013 | Park et al. |
| 2013/0328054 | A1 | 12/2013 | Tak et al. |

FOREIGN PATENT DOCUMENTS

| | | |
|---|---|---|
| JP | 3606015 B2 | 1/2005 |
| JP | 2009-289956 A | 12/2009 |
| KR | 10-2007-0007512 A | 1/2007 |
| KR | 10-0680700 B1 | 2/2007 |
| KR | 10-2008-0010261 A | 1/2008 |
| KR | 10-0856234 B1 | 9/2008 |
| KR | 10-2013-0081956 A | 7/2013 |
| KR | 10-2013-0139107 A | 12/2013 |

OTHER PUBLICATIONS

European Search Report mailed on Apr. 2, 2015.
Feltin E., et al., "Stress Control in GaN Grown on silicon (111) by Metalorganic Vapor Phase Epitaxy", Applied Physics Letters, American Institute of Physics, US, vol. 79, No. 20, Nov. 12, 2001, pp. 3230-3232.
Feltin E., et al., "Crack-FreeThick GaN Layers on Silicon (111) by Metalorganic Vapor Phase Epitaxy", Physica Status solidi, vol. 188, No. 2, Dec. 1, 2001, pp. 531-535.
Bläsing J., et al., "The Origin of Stress Reduction by Low-Temperature AlN interlayers", Applied Physics Letters, American Institute of Physics, US, vol. 8, No. 15, Oct. 7, 2002, pp. 2722-2724.

* cited by examiner

SEMICONDUCTOR BUFFER STRUCTURE, SEMICONDUCTOR DEVICE INCLUDING THE SEMICONDUCTOR BUFFER STRUCTURE, AND METHOD OF MANUFACTURING THE SEMICONDUCTOR DEVICE USING THE SEMICONDUCTOR BUFFER STRUCTURE

CROSS-REFERENCE TO RELATED APPLICATIONS

This application claims priority from Korean Patent Application No. 10-2013-0125542, filed on Oct. 21, 2013, in the Korean Intellectual Property Office, the disclosure of which is incorporated herein in its entirety by reference.

BACKGROUND

The inventive concept relates to a semiconductor buffer structure, a semiconductor device including the semiconductor buffer structure, and/or a method of manufacturing the semiconductor device using the semiconductor buffer structure.

As a substrate for forming a nitride-based semiconductor device, a sapphire substrate is often used. However, sapphire substrates are typically expensive and have a high hardness, they are typically not suitable for chip manufacturing. Sapphire substrates also generally have low electric conductivity. In the epitaxial growth of a large-size sapphire substrate, the substrate is bent at high temperature due to the low heat conductivity of sapphire. Accordingly, it is difficult to manufacture a large-area sapphire substrate. To overcome such limitations, nitride-based semiconductor devices using a silicon substrate instead of a sapphire substrate have been developed. The silicon substrate, due to having a higher heat conductivity than the sapphire substrate, does not need to be bent as much as a sapphire substrate, even at the high temperatures required for growing nitride thin films. Accordingly, growth of a large-size thin film may be possible with a silicon substrate.

However, when a nitride thin film is grown on a silicon substrate, the dislocation density increases due to a difference in lattice constant between the silicon substrate and the thin film, and cracks may be generated due to tensile stress caused by a difference in thermal expansion coefficient between the silicon substrate and the thin film. Thus, various buffer layer structures for growing a nitride thin film layer capable of avoiding cracks while having high crystallinity on a silicon substrate have been proposed.

A buffer layer offsets the lattice constant and thermal expansion coefficient differences between the silicon substrate and a target layer to be formed thereon, for example, a nitride semiconductor thin film. To grow the nitride semiconductor thin film, such as GaN, on the silicon substrate, an AlN nucleation layer is typically grown on the silicon substrate, and the GaN thin film is grown using the resulting substrate of AlN on GaN as a pseudo-substrate. To reduce dislocations and cracks in the GaN thin film, a buffer layer is typically formed on the nucleation layer.

When a GaN thin film is used for a Light Emitting Diode (LED) or a power device, the GaN thin film has to be grown to have low dislocation for performance improvement and to receive compressive stress for crack prevention. However, as the GaN thin film grows, stress evolves to tensile stress because of dislocation bending, and if there are too many dislocations, a crack is generated during the growth of the GaN thin film. Thus, the main objectives of using a buffer layer are stress control and removal of dislocations from the buffer layer. To this end, a buffer layer structure that has a lattice constant between the AlN nucleation layer and the GaN thin film, and in which the lattice constant changes in the form of a step grade or a continuous grade, may be proposed.

SUMMARY

At least one example embodiment includes a semiconductor buffer structure capable of reducing a crack in a nitride-based semiconductor thin film, a semiconductor device including the semiconductor buffer structure, and a method of manufacturing the semiconductor device using the semiconductor buffer structure.

According to at least one example embodiment, a semiconductor buffer structure includes a silicon substrate, a nucleation layer formed on the silicon substrate, and a buffer layer formed on the nucleation layer, the buffer layer including a first layer formed of a nitride semiconductor material having a uniform composition rate, a second layer formed of the same material as the nucleation layer on the first layer, and a third layer formed of the same material with the same composition ratio as the first layer on the second layer.

The nucleation layer may be composed of AlN.

The semiconductor buffer structure may further include a fourth layer formed of the same material as the nucleation layer on the third layer and a fifth layer formed of the same material with the same ratio as the first layer on the fourth layer.

A thickness of the first layer may be in a range of 10 nm-1000 nm.

The first layer may be formed of $B_xAl_yIn_zGa_{1-x-y-z}N$ ($0 \leq x < 1$, $0 < y < 1$, $0 \leq z < 1$, and $0 \leq x+y+z < 1$).

A thickness of the second layer may be in a range of 1 nm-200 nm.

Compressive stress may be formed on the buffer layer.

According to at least one example embodiment, a semiconductor device includes a silicon substrate, a nucleation layer formed on the silicon substrate, a buffer layer formed on the nucleation layer, and a nitride semiconductor layer formed on the buffer layer, the buffer layer including a first layer formed of a nitride semiconductor material having a uniform composition ratio, a second layer formed of the same material as the nucleation layer on the first layer, and a third layer formed of the same material with the same composition ratio as the first layer on the second layer.

The nucleation layer may be formed of AlN.

The semiconductor device may further include a fourth layer formed of the same material as the nucleation layer on the third layer and a fifth layer formed of the same material with the same composition as the first layer on the fourth layer.

The first layer may be formed of $B_xAl_yIn_zGa_{1-x-y-z}N$ ($0 \leq x < 1$, $0 < y < 1$, $0 \leq z < 1$, and $0 \leq x+y+z < 1$).

A thickness of the second layer may be in a range of 1 nm-200 nm.

The buffer layer may apply compressive stress to the nitride semiconductor layer.

The semiconductor device may further include a device layer formed on the nitride semiconductor layer, and the device layer may include one of a Light Emitting Diode (LED), a Laser Diode (LD), a Field Effect Transistor (FET), a High Electron Mobility Transistor (HEMT), and a Schottky diode.

According to at least one example embodiment, a method of manufacturing a semiconductor device includes providing a silicon substrate, forming a nucleation layer on the silicon substrate, forming a buffer layer on the nucleation layer, the buffer layer including a first layer formed of a nitride semiconductor material having a uniform composition ratio, a second layer formed of the same material as the nucleation layer on the first layer, and a third layer formed of the same material with the same composition ratio as the first layer on the second layer, and forming a nitride semiconductor layer on the buffer layer.

The method may further include forming a device layer on the nitride semiconductor layer.

The method may further include removing the silicon substrate.

At least a portion of the nucleation layer and the buffer layer may be removed together when the silicon substrate is removed.

The method may further include forming a concave-convex pattern on a surface exposed by removal of the silicon substrate.

According to at least one example embodiment, a semiconductor buffer structure includes a substrate, a nucleation layer on the substrate, the nucleation layer comprising a first material, a nitride semiconductor layer on the nucleation layer, and a buffer layer between the nucleation layer and the nitride semiconductor layer, the buffer layer being configured to offset at least one of a lattice constant difference and a thermal expansion coefficient different between the substrate and the nitride semiconductor layer.

BRIEF DESCRIPTION OF THE DRAWINGS

At least one example embodiment of the inventive concept will be more clearly understood from the following detailed description taken in conjunction with the accompanying drawings in which.

DETAILED DESCRIPTION OF THE EMBODIMENTS

Figure 1:
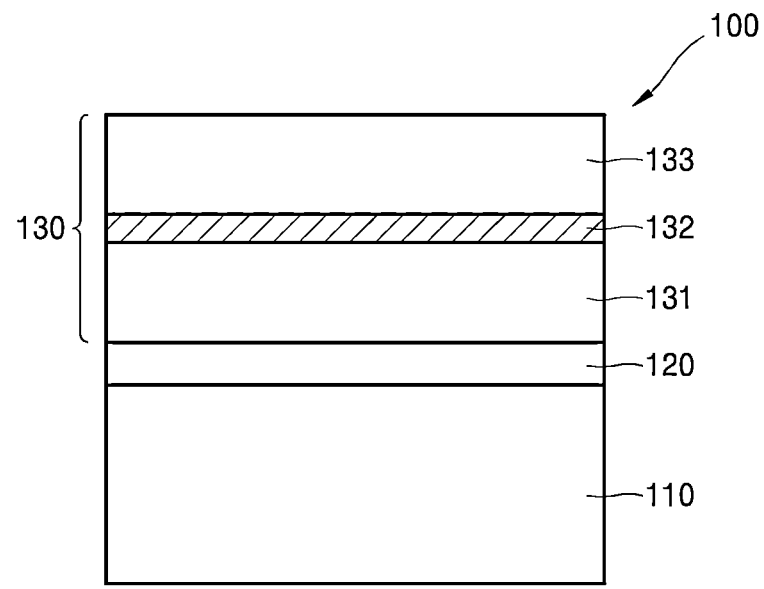
FIG. 1 is a cross-sectional view illustrating a semiconductor buffer structure according to an example embodiment.

Reference will now be made in detail to at least one example embodiment, examples of which are illustrated in the accompanying drawings, wherein like reference numerals refer to like elements throughout. In this regard, the example embodiments may have different forms and should not be construed as being limited to the descriptions set forth herein. Accordingly, the at least one example embodiment are merely described below, by referring to the figures, to explain example features. Expressions such as "at least one of," when preceding a list of elements, modify the entire list of elements and do not modify the individual elements of the list.

Hereinafter, a semiconductor buffer structure, a semiconductor device including the semiconductor buffer structure, and a method of manufacturing the semiconductor device according to at least one example embodiment of the present disclosure will be described with reference to the accompanying drawings. Throughout the drawings, like reference numerals refer to like components, and the size of each component may have been exaggerated for clarity and convenience of description in the drawings. Embodiments described below are merely exemplary and various modifications may be possible from the embodiments. In the following description, an expression such as "above" or "on" may include "on in a non-contact manner" as well as "directly on in a contact manner".

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of at least one example embodiment.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

At least one example embodiment are described herein with reference to cross-sectional illustrations that are schematic illustrations of idealized embodiments (and intermediate structures) of at least one example embodiment. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain example embodiments of the present description.

FIG. 1 is a cross-sectional view showing a semiconductor buffer structure 100 according to at least one example embodiment.

The semiconductor buffer structure 100 may include a silicon substrate 110, a nucleation layer 120 formed on the silicon substrate 110, and a buffer layer 130 formed on the nucleation layer 120.

The silicon substrate 110 may be a substrate having a Si 111 crystalline surface.

The nucleation layer 120 is provided for forming a nucleus of crystal growth and prevents a melt-back phenomenon that occurs due to reaction between the silicon substrate 110 and the buffer layer 130. The melt-back phenomenon refers to a phenomenon in which Ga contained in the buffer layer 130 reacts in contact with the silicon substrate 110. If the melt-back phenomenon occurs, the crystallinity of a semiconductor device collapses. The nucleation layer 120 may also allow good wetting of the buffer layer 130 that is to grow under the nucleation layer 120. The nucleation layer 120 may be made of AlN.

The buffer layer 130 is structured such that one or more layers formed of the same material as the material of the nucleation layer 120 are inserted into a layer formed of a nitride semiconductor material having a uniform composition ratio, like a single composition material such as AlInGaN or BAlInGaN. The buffer layer 130 may include a first layer 131 formed of $B_xAl_yIn_zGa_{1-x-y-z}N$ ($0 \leq x < 1$, $0 < y < 1$, $0 \leq z < 1$, and $0 \leq x+y+z < 1$) having a uniform composition ratio, a second layer 132 formed of the same material as the nucleation layer 120 on the first layer 131, and a third layer 133, formed of the same material with the same composition ratio as the material and composition ratio of the first layer 131, on the second layer 132.

The second layer 132 may be formed of AlN. The second layer 132 may be formed to have a thickness of 1-200 nm, for example, a thickness of 5 nm-100 nm or 10 nm-50 nm.

The first layer 131 and the third layer 133 may be formed to have a thickness of 10 nm-1000 nm, for example, 50 nm-500 nm.

The thicknesses of the first layer 131, the second layer 132, and the third layer 133 may be selected in various ranges from among the above-described ranges to form compressive stress over the entire buffer layer 130 and reduce dislocation.

The buffer layer 130 offsets differences in lattice constant and thermal expansion coefficient between the silicon substrate 110 and a target layer to be formed thereon, for example, a nitride semiconductor thin film, and also reduces dislocation by bending dislocation in interfaces between the first to third layers 131-133 of the buffer layer 130.

Dislocation reduction is achieved by bending dislocation in an interface having a large lattice constant difference or forming a half loop. By using this feature, in the current example embodiment, a large lattice constant difference is maintained in the buffer layer 130 to reduce dislocation. That is, for dislocation reduction, a step in which a lattice constant difference is large is inserted into a buffer structure.

Figure 2:
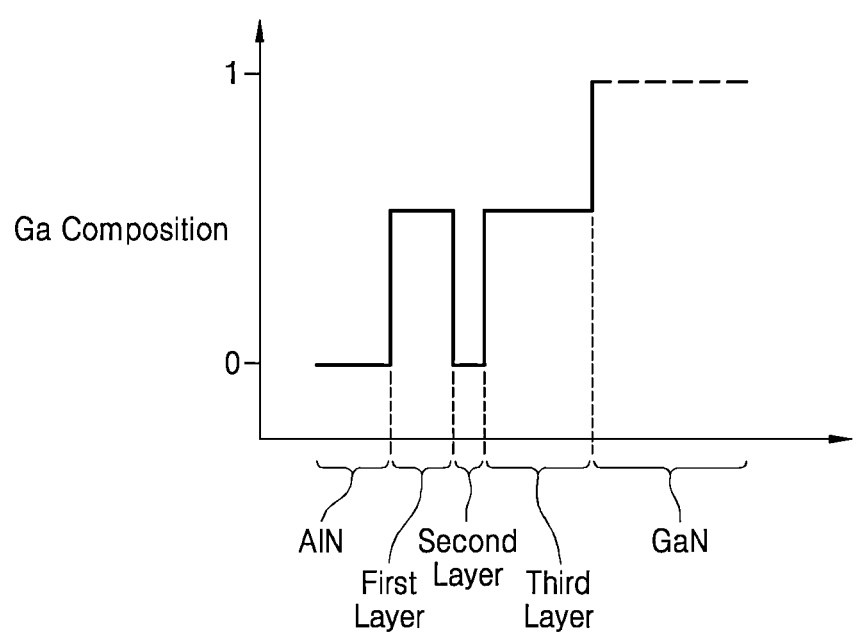
FIG. 2 shows a gallium (Ga) composition of a buffer layer included in the example semiconductor buffer structure illustrated in FIG. 1.

FIG. 2 shows a gallium (Ga) composition of the buffer layer 120 included in the semiconductor buffer structure illustrated in FIG. 1, according to at least one example embodiment.

Referring to FIG. 2, the first layer 131 and the third layer 133 contain Ga at a ratio of 0-1, and for example, a ratio of Ga may be between 0.2 and 0.7. The second layer 132 between the first layer 131 and the third layer 133 is formed of AlN that does not contain Ga. The second layer 132 is inserted to maximize a lattice constant difference in a buffer structure having a desired (or alternatively predetermined) rate of Ga, thus leading dislocation bending and encouraging stress control.

The first layer 131 and the third layer 133 have single compositions, respectively, where each of the first layer 131 and the third layer 133 has a uniform composition ratio, thus forming the same lattice constant therein. The first layer 131 and the third layer 133 may form smaller lattice constants than the target layer, GaN, and thus exert compressive stress on the target layer.

Figure 3A:
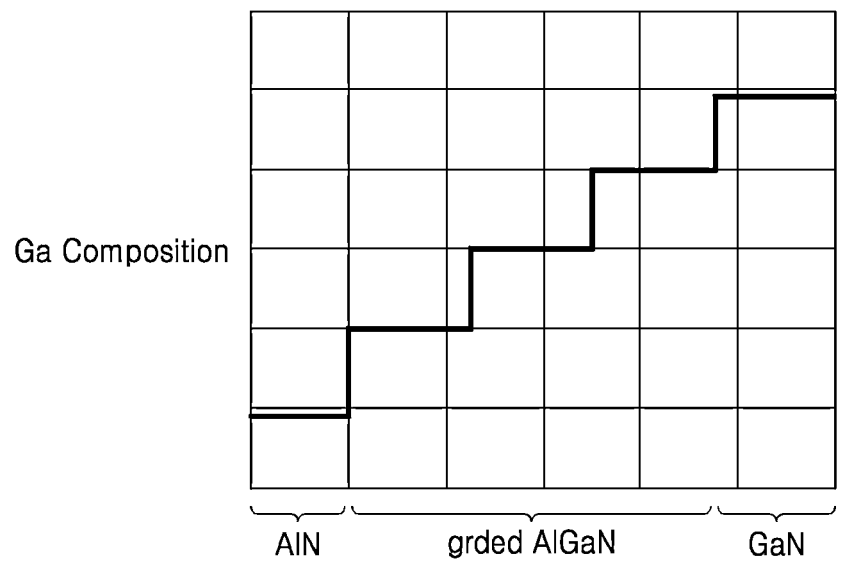
FIGS. 3A and 3B show Ga compositions of buffer layers in Comparative Example 1 and Comparative Example 2, respectively.
Figure 3B:
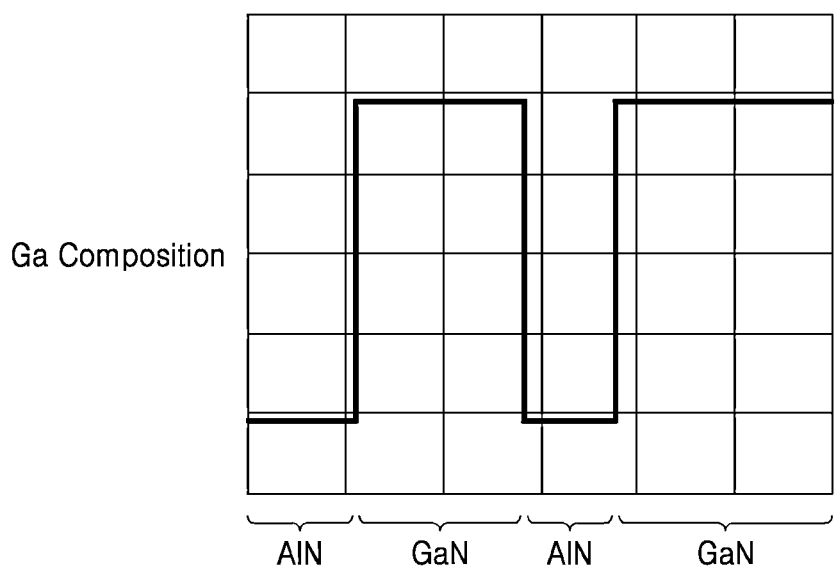

FIGS. 3A and 3B show a Ga composition of a buffer layer in Comparative Example 1 and Comparative Example 2, respectively.

Comparative Example 1 shows a structure in which a buffer layer is formed in a graded AlGaN form between AlN and GaN. Comparative Example 2 shows a structure in which an AlN layer is inserted into a GaN layer.

Figure 4:
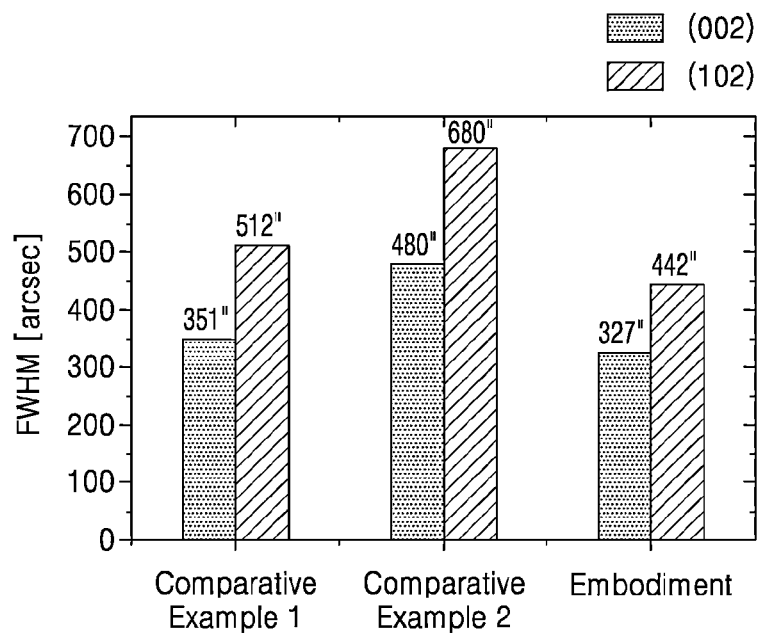
FIG. 4 is a graph showing the crystallinity in (002) direction and (102) direction of GaN thin films formed on buffer layers of Comparative Example 1, Comparative Example 2, and example Embodiment disclosure.

FIG. 4 is a graph showing the crystallinity in the (002) direction and the (102) direction of GaN thin films formed on buffer layers of Comparative Example 1, Comparative Example 2, and at least one example Embodiment of the present disclosure.

The GaN thin film is structured such that a GaN layer having a thickness of about 1 µm, an $Al_{0.6}Ga_{0.4}N$ layer having a thickness of about 30 nm, a GaN layer having a thickness of about 30 nm, a GaN layer having a thickness of about 0.25 µm, and an n-GaN layer having a thickness of about 3 µm and a doping density of about $5 \times 10^{18}$ cm$^{-3}$, are sequentially stacked on an AlN layer having a thickness of 30 nm.

Referring to FIG. 4, in an example Embodiment, in X-ray diffraction measurement, the Full Width at Half Maximum (FWHM) in the (002) and (102) directions is smaller than in the FWHM of Comparative Example 1 and Comparative Example 2. More specifically, the FWHM in the (002)/(102) directions in the example Embodiment is improved from 351″/512″ to 327″/442″ compared to Comparative Example 1, and from 480″/680″ to 327″/442″ compared to Comparative Example 2. As such, the FWHM reduction means crystallinity improvement and corresponds to a dislocation density of about $5 \times 10^{18}$ cm$^{-2}$ or less.

Figure 5:
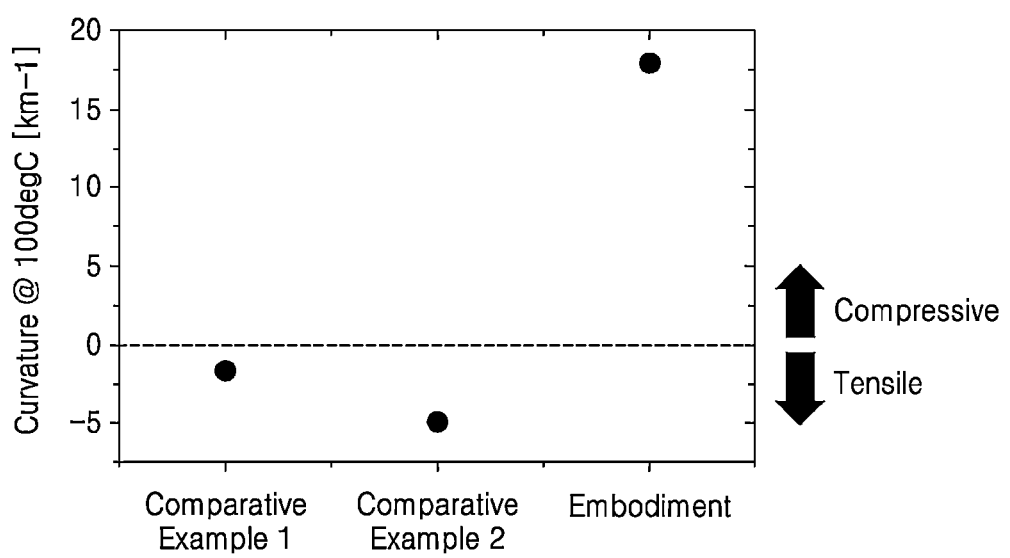
FIG. 5 is a graph showing stress applied by a buffer layer to a target layer in Comparative Example 1, Comparative Example 2, and example Embodiment.

FIG. 5 is a graph showing stress applied by a buffer layer to a target layer in Comparative Example 1, Comparative Example 2, and an example Embodiment.

A curvature formed by a surface of a buffer layer is analyzed, in which a positive (+) curvature corresponds to compressive stress and a negative (−) curvature corresponds to tensile stress.

Referring to FIG. 5, the example Embodiment has a compressive strength that is substantially greater than the respective compressive strengths of Comparative Example 1 and Comparative Example 2. More specifically, in an 8-inch and 1.5 T wafer, a curvature difference of about 20 km$^{-1}$ with Comparative Example 1 and a curvature difference of about 23 km$^{-1}$ with Comparative Example 2 exist, such that more compressive stress is applied to the example Embodiment. This compressive stress may compensate for tensile stress formed on a target layer to be grown on the buffer layer.

From FIGS. 4 and 5, it can be seen that more dislocation is removed from the buffer layer according to the example Embodiment, and thus stress evolution on upper layers of the buffer layer is reduced, thereby improving both crystallinity and compressive stress.

Figure 6:
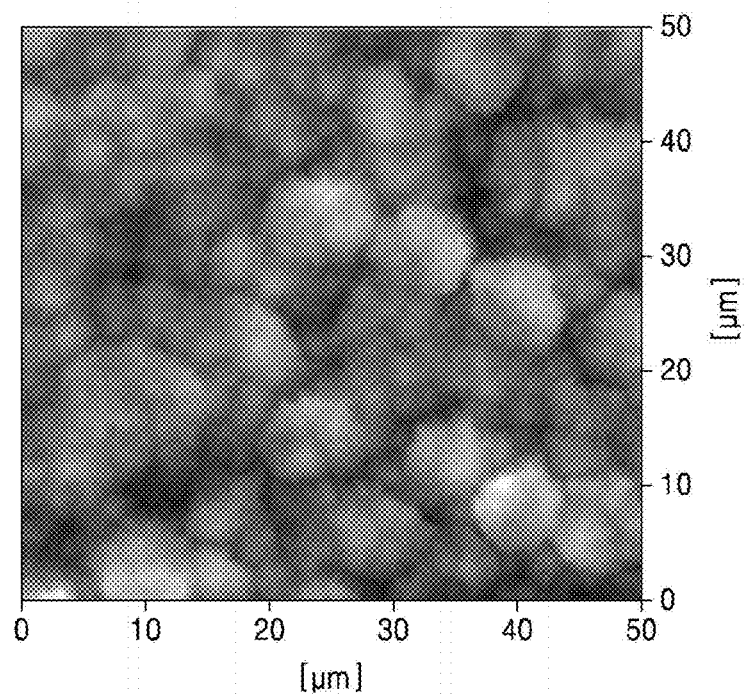
FIG. 6 illustrates an Atomic Force Microscope (AFM) image showing a morphology of a buffer layer according to an example embodiment.
Figure 7:
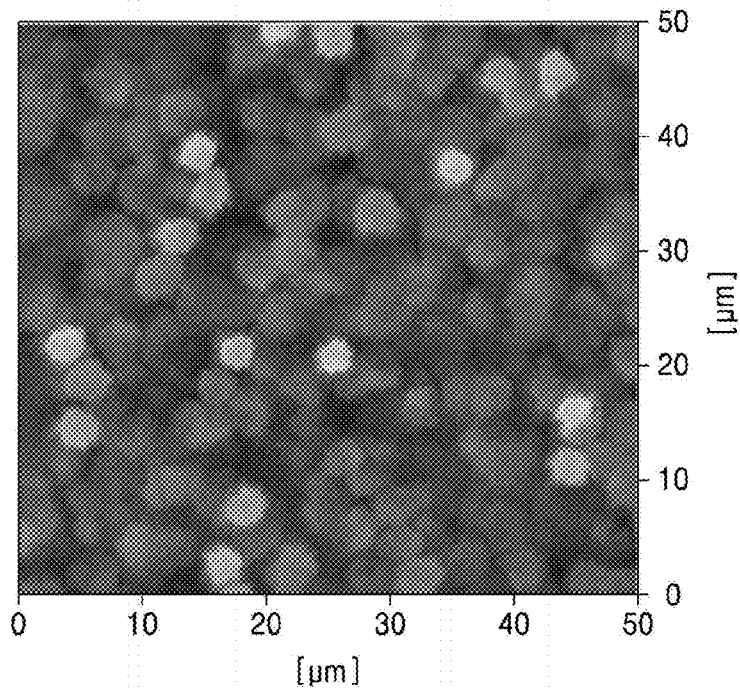
FIG. 7 illustrates an AFM image showing a morphology of a buffer layer in Comparative Example 1.

A reason for this phenomenon may be known from a morphology of the buffer layer illustrated in FIGS. 6 and 7.

FIGS. 6 and 7 illustrate an Atomic Force Microscope (AFM) image showing a morphology of a buffer layer according to an example embodiment, and an AFM image showing a morphology of a buffer layer in Comparative Example 1, respectively.

Referring to FIGS. 6 and 7, the buffer layer according to an example Embodiment is grown in the form of a column that is larger than Comparative Example 1. In this case, in a process of stacking a GaN thin film grown on the buffer layer according to the example Embodiment, edge type dislocation based on merging of different columns is smaller than in a case where a GaN thin film is grown on a layer having a smaller column structure. This feature may also be clearly seen from the graph illustrated in FIG. 4, in which a value in the (102) direction, which represents mixed & edge type dislocation, is further improved when compared to a value in the (002) direction, which is related to screw dislocations.

Figure 8:
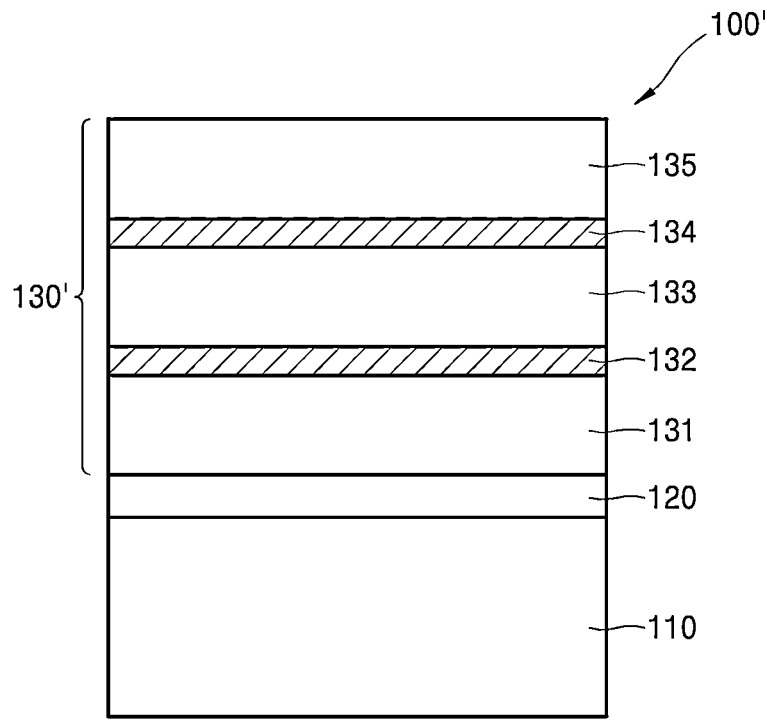
FIG. 8 is a cross-sectional diagram showing a semiconductor buffer structure according to another example embodiment.
Figure 9:
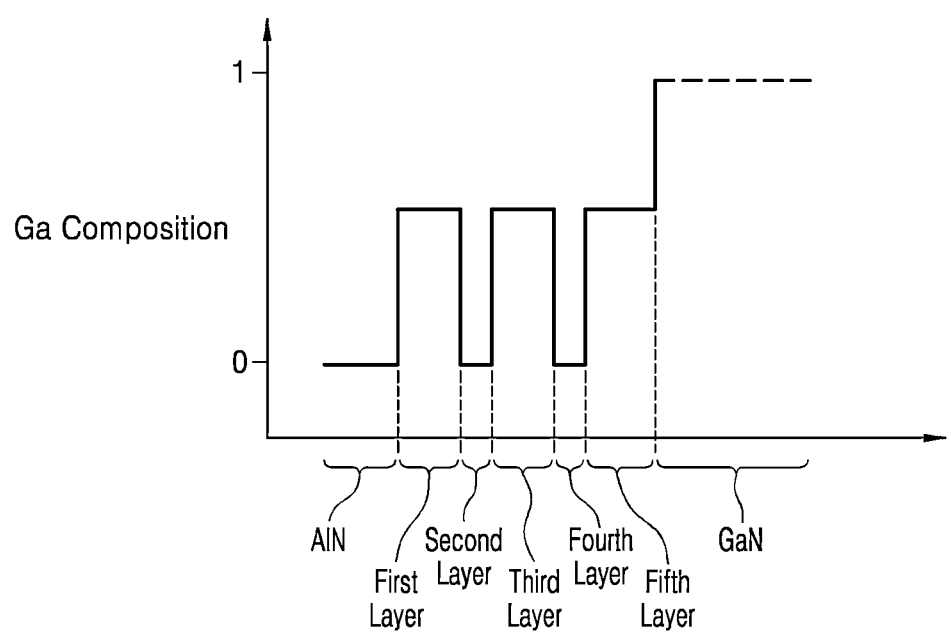
FIG. 9 is a graph showing a Ga composition of a buffer layer of a semiconductor buffer structure illustrated in FIG. 8.

FIG. 8 is a cross-sectional view showing a semiconductor buffer structure 100′ according to another example embodiment. FIG. 9 is a graph showing a Ga composition of a buffer layer of the semiconductor buffer structure 100′ illustrated in FIG. 8.

The semiconductor buffer structure 100′ may include the silicon substrate 110, the nucleation layer 120, and the buffer layer 130. The buffer layer 130 may include the first layer 131 formed of $B_xAl_yInzGa_{1-x-y-z}N$ (0≤x<1, 0<y<1, 0≤z<1, and 0≤x+y+z<1) having a uniform composition ratio, the second layer 132 formed of the same material as the nucleation layer 120 on the first layer 131, and the third layer 133, formed of the same material and the same composition ratio as the material and composition ratio of the first layer 131, on the second layer 132. The buffer layer 130 may further include a fourth layer 134, formed of the same material as the nucleation layer 120, on the third layer 133, and a fifth layer 135, formed of the same material and the same composition ratio as the material and composition ratio of the first layer 131, on the fourth layer 134.

That is, the first layer 131, the third layer 133, and the fifth layer 135 contain $B_xAl_yInzGa_{1-x-y-z}N$ (0≤x<1, 0<y<1, 0≤z<1, and 0≤x+y+z<1) having a uniform constant ratio, and the second layer 132 and the fourth layer 134 may be formed of AlN.

The semiconductor buffer structure 100′ according to an example embodiment is structured such that a plurality of AlN layers are inserted into a $B_xAl_yInzGa_{1-x-y-z}N$ layer (0≤x<1, 0<y<1, 0≤z<1, and 0≤x+y+z<1) and other numbers of AlN layers may be further inserted.

The above-described semiconductor buffer structure proposes a buffer layer structure in which a nitride semiconductor thin film having a dislocation density may be grown on a silicon substrate.

When a nitride-based semiconductor thin film is grown on the foregoing semiconductor buffer structure, a crack in the nitride-based semiconductor thin film is reduced, thereby manufacturing a large-size semiconductor device with the silicon substrate.

Figure 10:
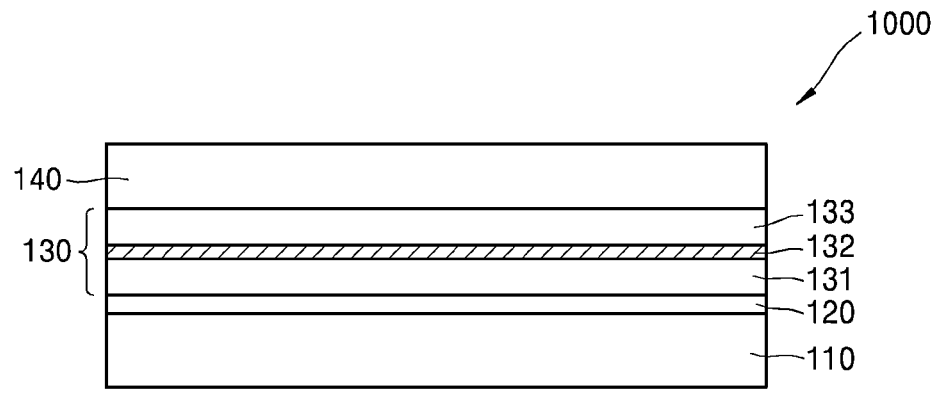
FIG. 10 is a cross-sectional view showing a semiconductor device according to an example embodiment.

FIG. 10 is a cross-sectional view illustrating a semiconductor device 1000 according to an example embodiment.

The semiconductor device 1000 may include the silicon substrate 110, the nucleation layer 120 formed on the silicon substrate 110, and the buffer layer 130 formed on the nucleation layer 120. The buffer layer 130 may include the first layer 131 formed of $B_xAl_yInzGa_{1-x-y-z}N$ (0≤x<1, 0<y<1, 0≤z<1, and 0≤x+y+z<1) having a uniform composition ratio, the second layer 132 formed of the same material as the nucleation layer 120 on the first layer 131, the third layer 133 formed of the same material with the same composition ratio as the first layer 131 on the second layer 132, and a nitride semiconductor layer 140 formed on the buffer layer 130.

The buffer layer 130 is provided for growth with little dislocation such as a crack or dislocation when the nitride semiconductor layer 140 is grown on the silicon substrate 110, and the buffer layer 130 illustrated in FIG. 1 may also be modified to a buffer layer 130' illustrated in FIG. 8.

The nitride semiconductor layer 140 may be formed of a single layer or a plurality of layers, and include Ga-containing nitride, $Al_{x1}In_{y1}Ga_{1-x1-y1}N$ ($0 \le x1$, $y1 \le 1$, $x1+y1 < 1$), for example, at least one of GaN, InGaN, and AlInGaN. For the nitride semiconductor layer 140, un-doping or doping may be selectively used. For example, the nitride semiconductor layer 140 may include a plurality of doped layers of different types, and may form, for example, a PN junction structure of a Light Emitting Diode (LED).

The semiconductor buffer structure 100 according to an example embodiment may be used as a template for forming various types of semiconductor devices. For example, the nitride semiconductor layer 140 may form a device layer such as an LED, a Schottky diode, a Laser Diode (LD), a Field Effect Transistor (FET), or a High Electron Mobility Transistor (HEMT). The device layer based on nitride semiconductor may also be formed on the nitride semiconductor layer 140.

The silicon substrate 110 may be removed during or after manufacturing of the semiconductor device 1000.

Figure 11:
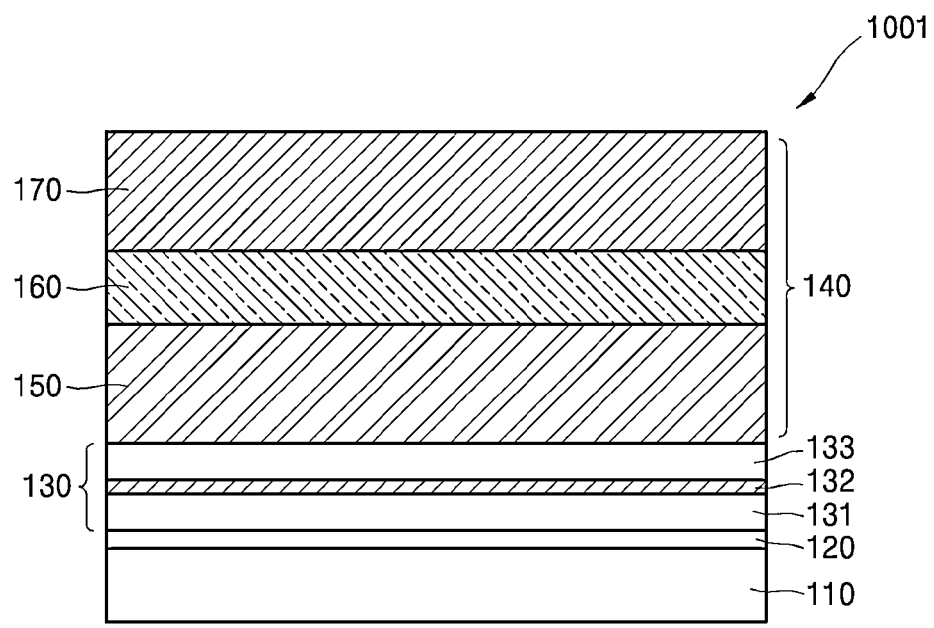
FIG. 11 is a cross-sectional view showing a semiconductor device according to another example embodiment.

FIG. 11 is a cross-sectional view illustrating a semiconductor device 1001 according to another example embodiment.

The semiconductor device 1001 according to an example embodiment is a light emitting device, and may include the silicon substrate 110, the nucleation layer 120 formed on the silicon substrate 110, and the nitride semiconductor layer 140 formed on the buffer layer 130 formed on the nucleation layer 120. The nitride semiconductor layer 140 may include a first-type semiconductor layer 150, an active layer 160, and a second-type semiconductor layer 170. An undoped nitride semiconductor layer may be further provided between the buffer layer 130 and the first-type semiconductor layer 150.

The first-type semiconductor layer 150 is a first-type doped semiconductor layer and may be formed of III-V group nitride semiconductor materials, for example, a semiconductor material made of $Al_xGa_yIn_zN$ ($0 \le x < 1$, $0 \le y \le 1$, $0 \le z \le 1$, and $x+y+z=1$) doped with n-type impurity that may be Si, Ge, Se, or Te.

The second-type semiconductor layer 170 is a second-type doped semiconductor layer and may be formed of III-V group nitride semiconductor materials, for example, a semiconductor material made of $Al_xGa_yIn_zN$ ($0 \le x \le 1$, $0 \le y \le 1$, $0 \le z \le 1$, and $x+y+z=1$) doped with p-type impurity that may be Mg, Zn, Be, Cd, Ba, or Ca.

The active layer 160 is a layer that emits light based on electron-hole recombination. Energy corresponding to an energy band gap of the active layer 160 may be emitted in the form of light. The active layer 160 may have a structure of a single quantum well or multi-quantum well by periodically changing x, y, and z values in $Al_xGa_yIn_zN$ to adjust the band gap. For example, a quantum well layer and a barrier layer may be paired in the form of InGaN/GaN, InGaN/InGaN, InGaN/AlGaN, or InGaN/InAlGaN to form a quantum well structure. The band gap energy is controlled according to an In mol fraction in an InGaN layer, thus adjusting a light-emitting wavelength band. Typically, when an In mol fraction changes by about 1%, a light-emitting wavelength is shifted by about 5 nm.

Although the first-type semiconductor layer 150 and the second-type semiconductor layer 170 are illustrated as single-layer structures, they may also be composed of a plurality of layers.

Figure 12:
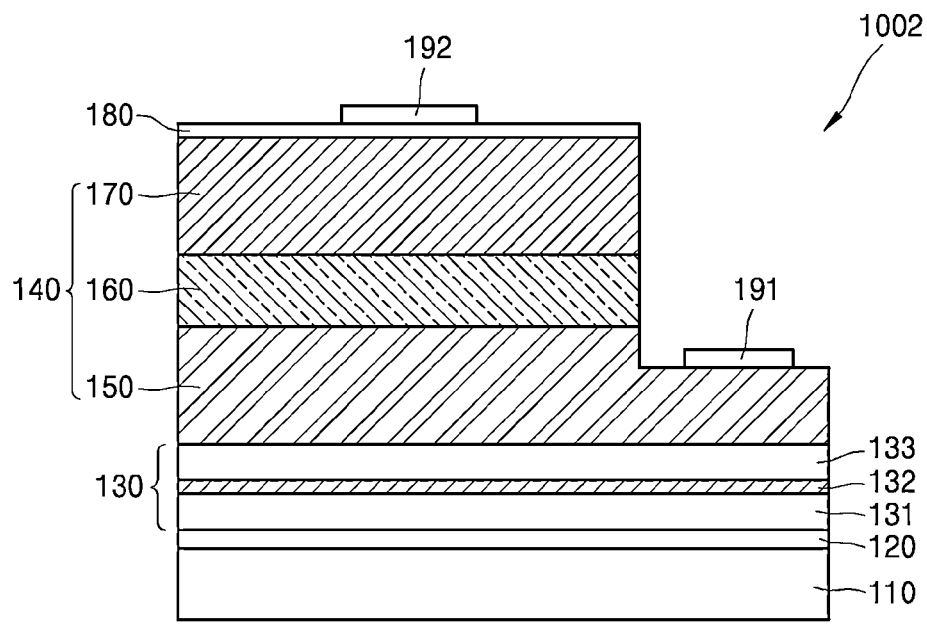
FIG. 12 is a cross-sectional view showing a semiconductor device according to another example embodiment.
Figure 13:
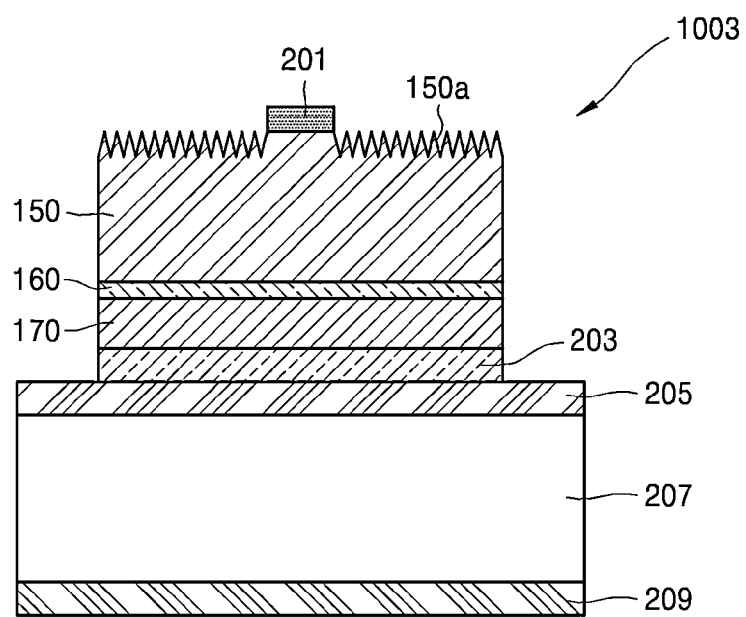
FIG. 13 is a cross-sectional view showing a semiconductor device according to another example embodiment.
Figure 14:
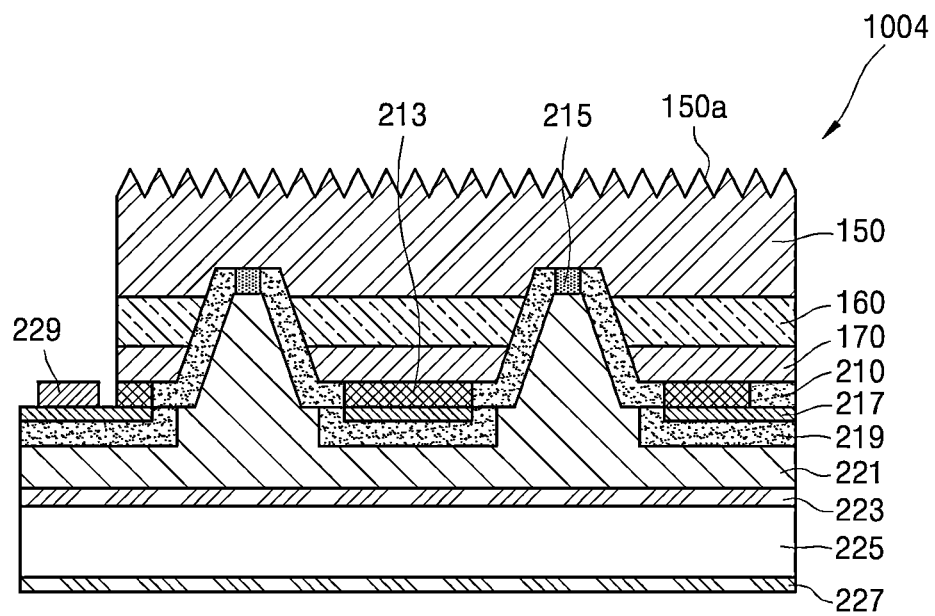
FIG. 14 is a cross-sectional view showing a semiconductor device according to another example embodiment.

The semiconductor device 1001 illustrated in FIG. 11 may have various forms of electrode structures that inject electric current for recombination of electrons and holes in the active layer 160, as illustrated in FIGS. 12 to 14.

FIG. 12 is a cross-sectional view showing a semiconductor device 1002 according to an example embodiment.

Referring to FIG. 12, a first electrode 191 is formed on the first-type semiconductor layer 150 exposed by etching desired (or alternatively predetermined) regions of the second-type semiconductor layer 170, the active layer 160, and the first-type semiconductor layer 150, and a second electrode 192 is formed on the second-type semiconductor layer 170. A transparent electrode layer 180 may be further formed between the second-type semiconductor layer 170 and the second electrode 192.

The type of chip structure described above is referred to as an epi-up structure.

The first electrode 191 and the second electrode 192 may be formed of a single metallic material such as Ag, Al, Ni, Cr, Pd, Cu, Pt, Sn, W, Au, Rh, Ir, Ru, Mg, or Zn, or an alloy thereof. The first electrode 191 and the second electrode 192 may be formed to have a structure of two or more layers, such as Ni/Ag, Zn/Ag, Ni/Al, Zn/Al, Pd/Ag, Pd/Al, Ir/Ag. Ir/Au, Pt/Ag, Pt/Al, or Ni/Ag/Pt.

The transparent electrode layer 180 may be formed of Transparent Conductive Oxide (TCO), and may also be formed of, for example, Indium Tin Oxide (ITO), Indium Zinc Oxide (IZO), Aluminum Zinc Oxide (AZO), ZnO, ZnO: Ga (GZO), $In_2O_3$, $SnO_2$, CdO, $CdSnO_4$, or $Ga_2O_3$.

FIG. 13 is a cross-sectional view showing a semiconductor device 1003 according to an example embodiment of the present disclosure.

The semiconductor device 1003 is a light-emitting device having a vertical structure, from which the silicon substrate 110, the nucleation layer 120, and the buffer layer 130 used for epitaxial growth are removed and in which a support substrate 207 is bonded toward the second-type semiconductor layer 170.

A top surface of the first-type semiconductor layer 150 exposed after removal of the silicon substrate 110, the nucleation layer 120, and the buffer layer 130 forms a seesaw, or an alternately concave-convex surface 150a, having a seesaw or concave-convex pattern by being textured to improve light extraction efficiency. The concave-convex pattern is not limited to the illustrated form and may also have various intervals, heights, and shapes and may be formed as an irregular pattern.

Although in FIG. 13, all of the silicon substrate 110, the nucleation layer 120, and the buffer layer 130 are removed, at least a part of the buffer layer 130 may remain on the first-type semiconductor layer 140 and may form the concave-convex surface 150a by being textured together with the first-type semiconductor layer 150.

The first electrode 201 is formed on the first-type semiconductor layer 150, and the second electrode 203 is formed on a bottom surface of the second-type semiconductor layer 170. A bonding metallic layer 205 is formed between the second electrode 203 and the support substrate 207. The bonding metallic layer 205 may be formed of, for example, Au/Sn. The support substrate 207 may be a Si substrate or a SiAl substrate. A back metallic layer 209 is formed on a bottom surface of the support substrate 207.

FIG. 14 is a cross-sectional view illustrating a semiconductor device 1004 according to an example embodiment.

Referring to FIG. 14, the semiconductor device 1004 is a light emitting device having a vertical-horizontal structure from which the silicon substrate 110, the nucleation layer 120, and the buffer layer 130 used for epitaxial growth are removed and in which a support substrate 225 is bonded toward the second-type semiconductor layer 170.

A top surface of the first-type semiconductor layer 150 exposed after removal of the silicon substrate 110, the nucleation layer 120, and the buffer layer 130 forms the concave-convex surface 150a by being textured to improve light extraction efficiency. Although it is illustrated in FIG. 14 that all of the silicon substrate 110, the nucleation layer 120, and the buffer layer 130 are removed, at least a part of the buffer layer 130 may remain on the first-type semiconductor layer 150 and may be textured together with the first-type semiconductor layer 150.

To form a first electrode 215 that contacts the first-type semiconductor layer 150, a plurality of via-holes (not illustrated) passing through the first-type semiconductor layer 150 and the active layer 160 are formed. A second electrode 213 is formed on the second-type semiconductor layer 170. A metallic layer 217 for connection with an electrode pad 229 is formed on the second electrode 213. A first passivation layer 210 is formed to cover sides of the plurality of via-holes and a part of the top surface of the second-type semiconductor layer 170, and a second passivation layer 219 is formed to cover the metallic layer 217. A barrier metallic layer 221 is connected with the first electrode 215 and fills the plurality of via-holes.

A bonding metallic layer 223 is formed on a top surface of the support substrate 225, and a back metallic layer 227 is formed on a bottom surface of the support substrate 225.

FIGS. 15A to 15J are diagrams for describing an example method of manufacturing the semiconductor device 1004 illustrated in FIG. 14.

Figure 15A:
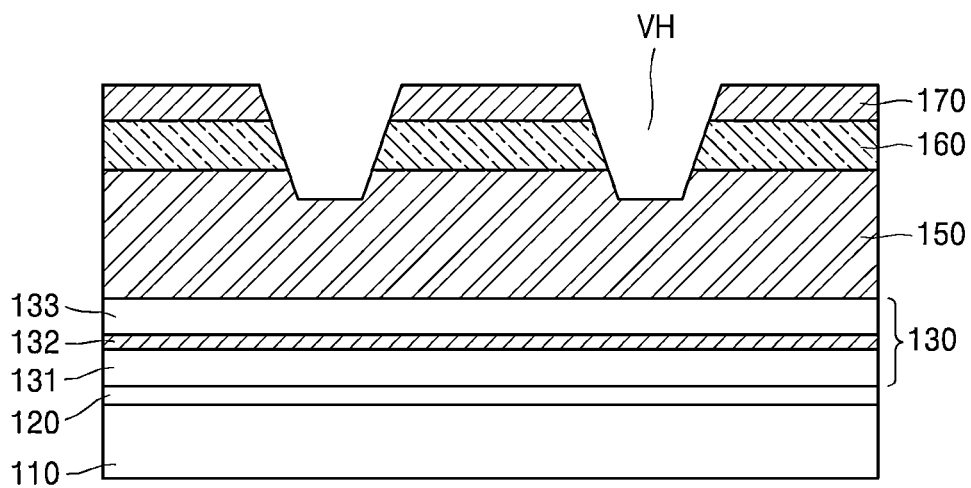
FIGS. 15A to 15J are diagrams describing an example method of manufacturing a semiconductor device illustrated in FIG. 14.

Referring to FIG. 15A, the silicon substrate 110, the nucleation layer 120, the buffer layer 130, the first-type semiconductor layer 150, the active layer 160, and the second-type semiconductor layer 170 are sequentially formed. An undoped nitride semiconductor layer may be further formed between the buffer layer 130 and the first-type semiconductor layer 150. Next, a plurality of Via-Holes (VHs) passing through the second-type semiconductor layer 170 and the active layer 160 to expose a part of the first-type semiconductor layer 150, are formed.

A process of forming the nucleation layer 120, the buffer layer 130, the first-type semiconductor layer 150, the active layer 160, and the second-type semiconductor layer 170 on the silicon substrate 110 may use a well-known semiconductor growth method such as Metal-organic Chemical Vapor Deposition (MOCVD), Molecular Beam Epitaxy (MBE), Hybrid Vapor Phase Epitaxy (HVPE), or the like.

When the first-type semiconductor layer 150 and the second-type semiconductor layer 170 are formed, an impurity gas is also supplied for n-type or p-type doping. The impurity gas for N-type impurity may be Si, Ge, Se, or Te, and the impurity gas for P-type impurity may be Zn, Cd, Be, Mg, Ca, or Ba.

Figure 15B:
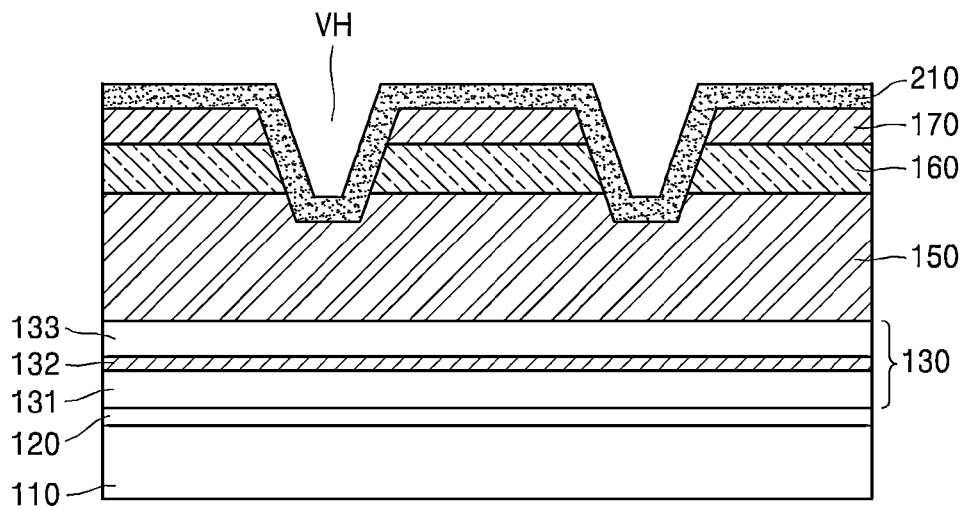

Referring to FIG. 15B, the first passivation layer 210 is formed along the top surface of the second-type semiconductor layer 170 and inner surfaces of the VHs. The first passivation layer 210 may be formed by depositing an insulating material, for example, $SiO_2$, $Al_2O_3$, or the like, on a surface of the second-type semiconductor layer 170 and along the walls and bottom side of the VHs.

Figure 15C:
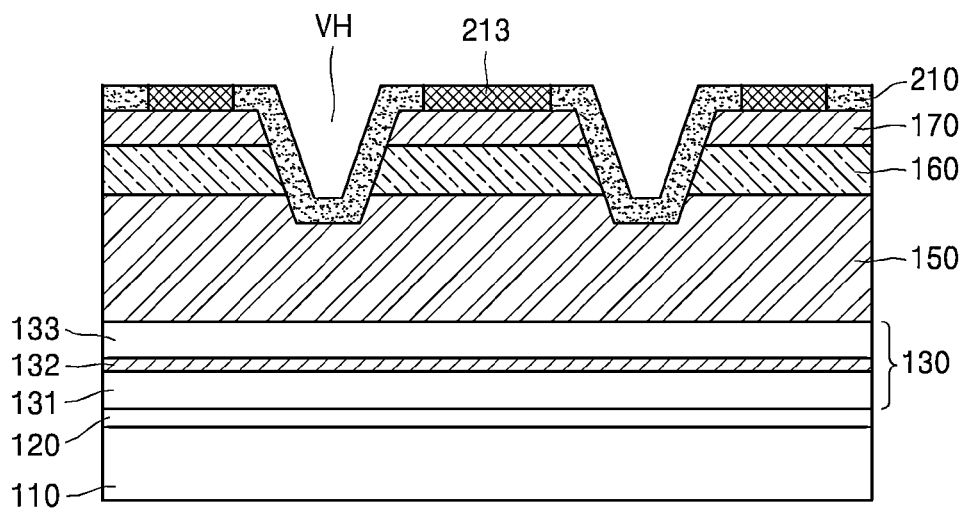

Referring to FIG. 15C, the second electrode 213 is formed on the second-type semiconductor layer 170 exposed by etching a part of the first passivation layer 210 on the second-type semiconductor layer 170.

Figure 15D:
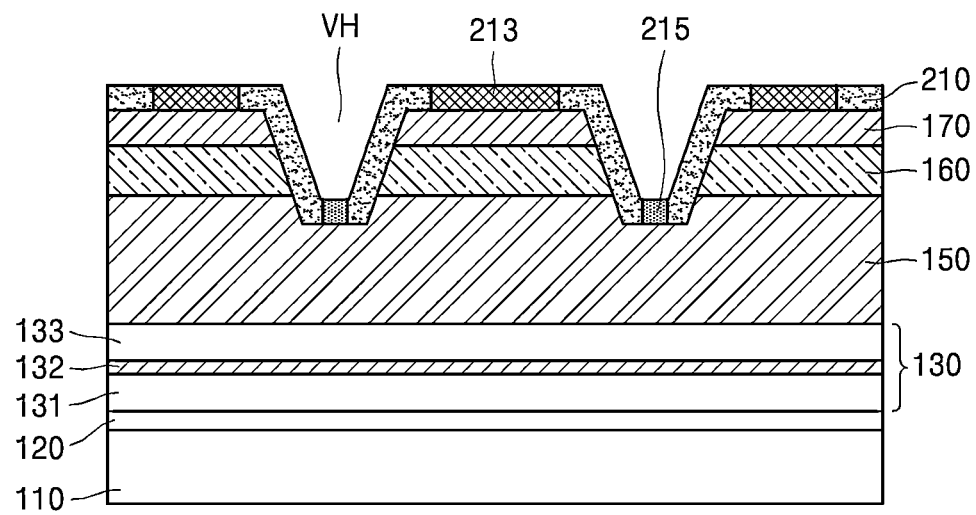

Referring to FIG. 15D, the first electrode 215 is formed on the first-type semiconductor layer 150 exposed by etching a part of the first passivation layer 210 on the first-type semiconductor layer 150, by depositing, sputtering, or plating a metallic material.

Figure 15E:
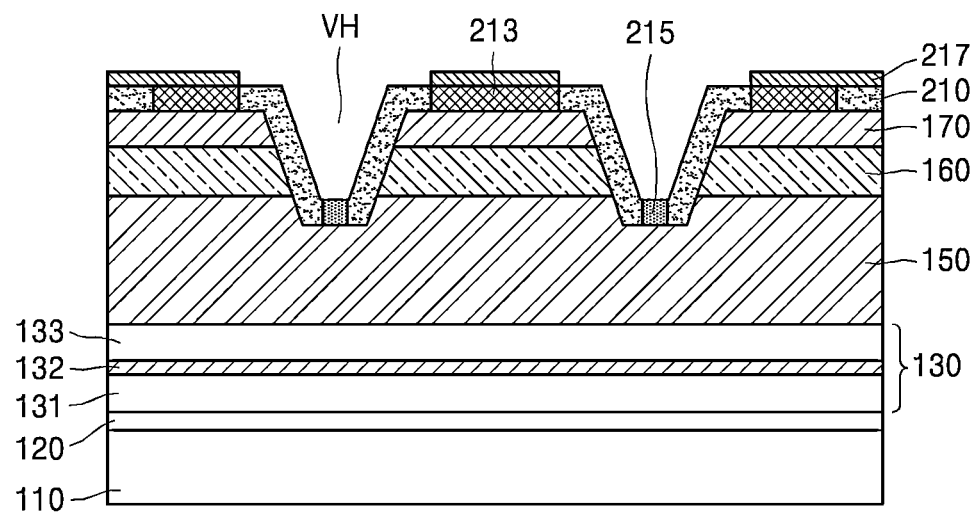

Referring to FIG. 15E, the metallic layer 217 is further formed on the second electrode 213. The metallic layer 217 may be used to connect an electrode pad to the second electrode 213.

Figure 15F:
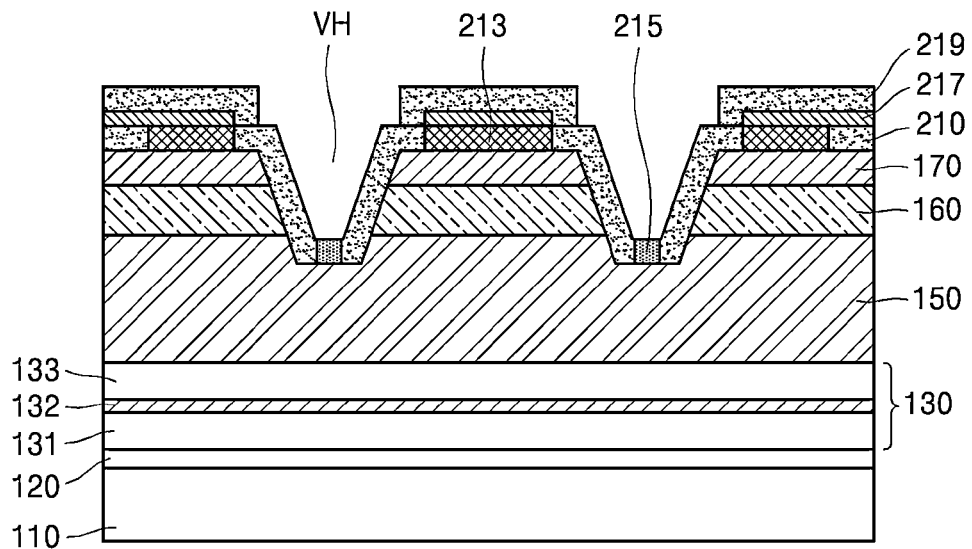

Referring to FIG. 15F, the second passivation layer 219 covering the metallic layer 217 is formed using an insulating material.

Figure 15G:
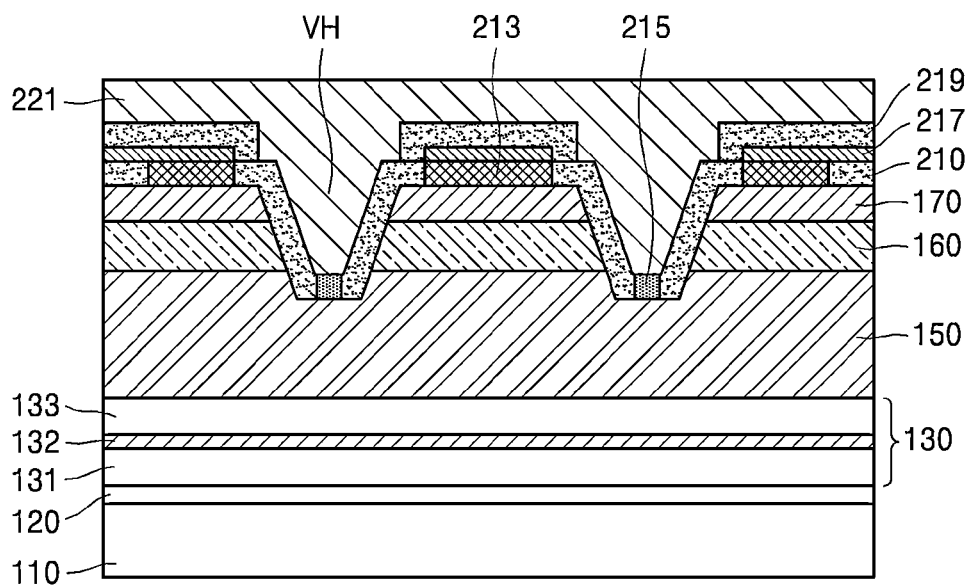

Referring to FIG. 15G, the barrier metallic layer 221 is formed to be connected with the first electrode 215, to fill the VHs as a whole, and to cover the second passivation layer 219. The barrier metallic layer 221 is insulated from the second electrode 213, the active layer 160, and the second-type semiconductor layer 170 and is electrically connected with the first electrode 215, through the first passivation layer 210 and the second passivation layer 219.

Figure 15H:
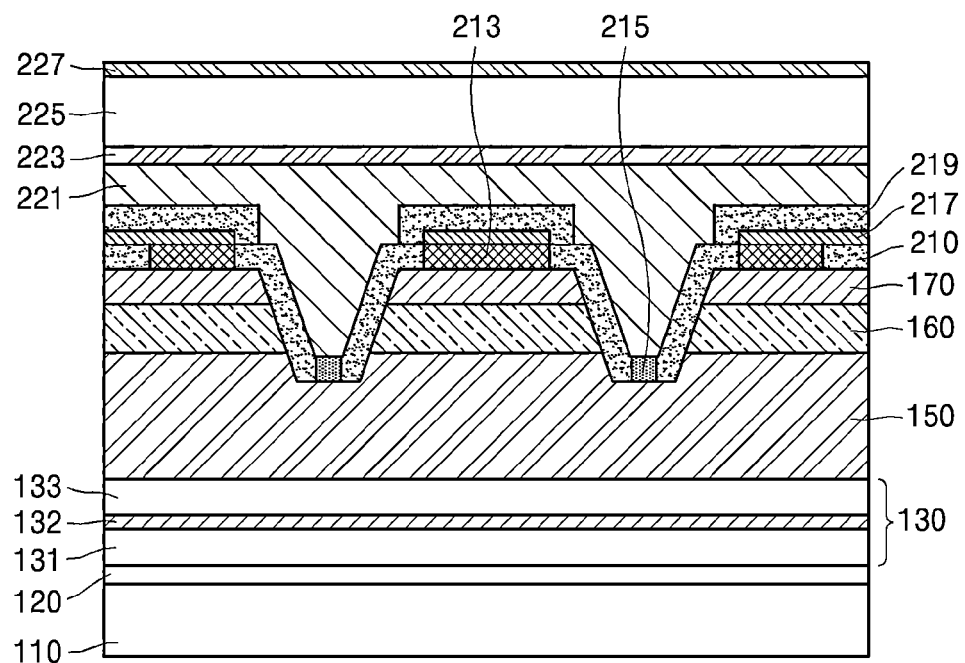

Referring to FIG. 15H, the support substrate 225 is attached onto the barrier metallic layer 221. The support substrate 225 may be a Si substrate, a SiAl substrate, or the like. The back metallic layer 227 is formed on the top surface of the support substrate 225, and the bonding metallic layer 223 is formed between the support substrate 225 and the barrier metallic layer 221.

Figure 15I:
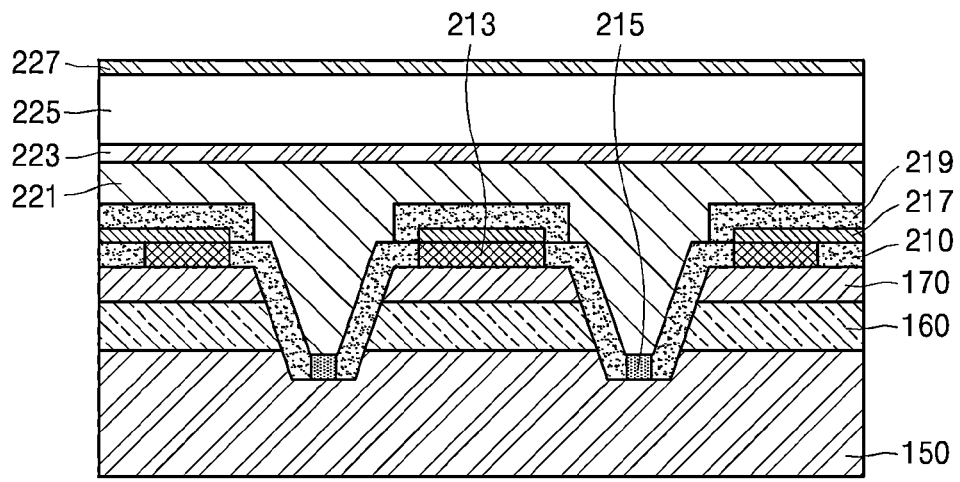

Referring to FIG. 15I, the silicon substrate 110, the nucleation layer 120, and the buffer layer 130 are removed. To remove the silicon substrate 110, etching or grinding may be used. Although it is illustrated in FIG. 15I that the nucleation layer 120 and the buffer layer 130 are completely removed, the nucleation layer 120 and the buffer layer 130 may not be entirely removed and may partially remain on the first-type semiconductor layer 150.

Figure 15J:
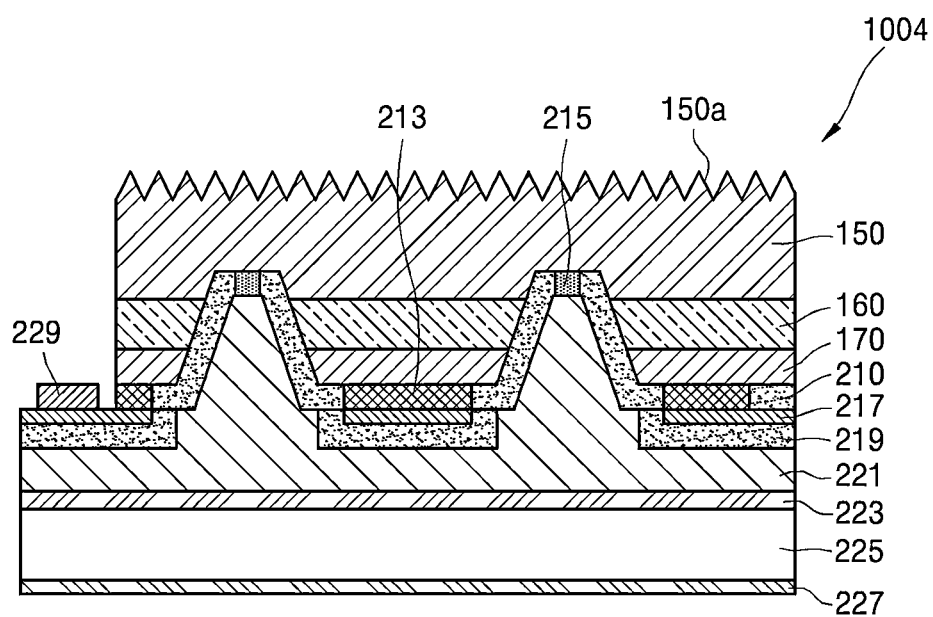

Referring to FIG. 15J, a top portion of the first-type semiconductor layer 150 is textured to form the concave-convex surface 150a. If a part of the buffer layer 130 remains on the first-type semiconductor layer 150, the part of the buffer layer 130 may also be textured to form the concave-convex surface 150a together.

To expose the metallic layer 217, the first-type semiconductor layer 150, the active layer 160, and the second-type semiconductor layer 170 are partially etched and the electrode pad 229 is formed on the exposed metallic layer 217.

Figure 16:
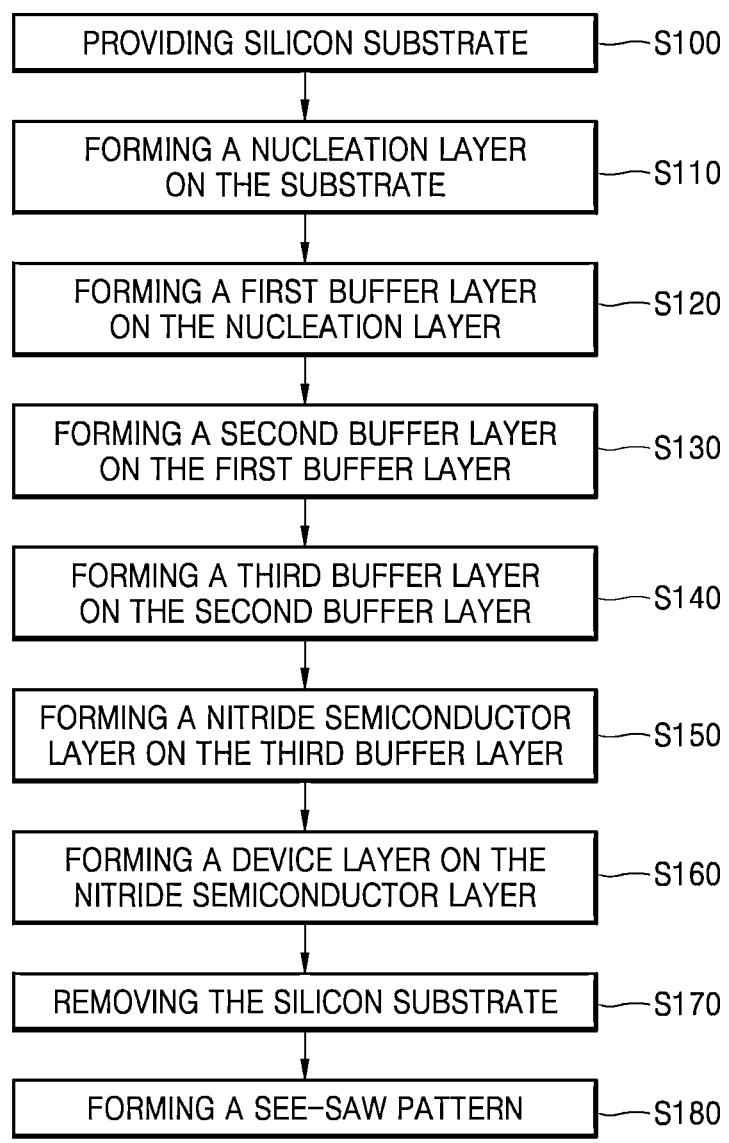
FIG. 16 is a flow chart illustrating a method of manufacturing a semiconductor device, according to at least one example embodiment.

FIG. 16 is a flow chart illustrating a method of manufacturing a semiconductor device, according to at least one example embodiment. In FIG. 6, the method starts at S100, where a silicon substrate is provided. At S110, a nucleation layer is formed on the silicon substrate. At S120, a first buffer layer including a nitride semiconductor material having a uniform composition ratio is formed on the nucleation layer. At S130, a second buffer layer is formed on the first buffer layer. At S140, a third buffer layer is formed on the second buffer layer. At S150, a nitride semiconductor layer is formed on the third buffer layer. At S160, a device layer is formed on the nitride semiconductor layer. At S170, the silicon substrate is removed to expose at least a portion of the nitride semiconductor layer and of the buffer layer. At S170, a see-saw pattern is formed on the exposed surface of the nitride semiconductor layer and of the buffer layer.

To facilitate understanding of the various example features, at least one example embodiment of a semiconductor buffer structure, a semiconductor device including the semiconductor buffer structure, and a method of manufacturing the semiconductor device using the semiconductor buffer structure, have been described and illustrated in the accompanying drawings. However, it should be understood that the disclosed at least one example embodiment are merely intended to illustrate the present disclosure and do not limit the disclosure. It should also be understood that the present disclosure is not limited to the illustrated and provided description because various changes may be made by those of ordinary skill in the art.

What is claimed is:

1. A semiconductor buffer structure between a silicon substrate and a nitride semiconductor layer comprising:
   a nucleation layer directly on the silicon substrate, the nucleation layer including a material having a uniform composition ratio; and
   a buffer layer directly on the nucleation layer, the buffer layer including:
      a first layer including a nitride semiconductor material having a uniform composition ratio, the first layer having a first lattice constant which is smaller than a lattice constant of the nitride semiconductor layer;
      a second layer, including a same material as the nucleation layer, directly on the first layer, the second layer having a second lattice constant which is equal to a lattice constant of the nucleation layer; and
      a third layer, including a same material and a same composition ratio as the first layer, directly on the second layer, the third layer having a third lattice constant which is equal to the first lattice constant,
   wherein the nitride semiconductor layer is disposed directly on the third layer.

2. The semiconductor buffer structure of claim 1, wherein the nucleation layer comprises AlN.

3. The semiconductor buffer structure of claim 1, wherein a thickness of the first layer is in a range of 50 nm-500 nm.

4. The semiconductor buffer structure of claim 1, wherein the first layer comprises BxAlyInzGa1-x-y-zN ($0 \leq x < 1$, $0 < y < 1$, $0 \leq z < 1$, and $0 \leq x+y+z < 1$).

5. The semiconductor buffer structure of claim 1, wherein a thickness of the second layer is in a range of 1 nm-200 nm.

6. The semiconductor buffer structure of claim 1, wherein compressive stress is formed on the buffer layer.

7. A semiconductor device comprising:
   a silicon substrate;
   a nucleation layer directly on the silicon substrate, the nucleation layer including a material having a uniform composition ratio; and
   a buffer layer directly on the nucleation layer, the buffer layer including:
      a first layer including a nitride semiconductor material having a uniform composition ratio;
      a second layer, including a same material as the nucleation layer, directly on the first layer; and
      a third layer, including a same material and a same composition ratio as the first layer, directly on the second layer;
   a nitride semiconductor layer directly on the third layer, wherein
   the first layer has a first lattice constant which is smaller than a lattice constant of the nitride semiconductor layer, the second layer has a second lattice constant which is equal to a lattice constant of the nucleation layer, and the third layer has a third lattice constant which is equal to the first lattice constant.

8. The semiconductor device of claim 7, wherein the nucleation layer comprises AlN.

9. The semiconductor device of claim 7, wherein the first layer comprises BxAlyInzGa1-x-y-zN ($0 \leq x < 1$, $0 < y < 1$, $0 \leq z < 1$, and $0 \leq x+y+z < 1$).

10. The semiconductor device of claim 7, wherein a thickness of the second layer is in a range of 1 nm-200 nm.

11. The semiconductor device of claim 7, wherein the buffer layer applies compressive stress to the nitride semiconductor layer.

12. The semiconductor device of claim 7, further comprising a device layer on the nitride semiconductor layer.

13. The semiconductor device of claim 12, wherein the device layer comprises one of a Light Emitting Diode (LED), a Laser Diode (LD), a Field Effect Transistor (FET), a High Electron Mobility Transistor (HEMT), and a Schottky diode.

14. A semiconductor device comprising:
   a silicon substrate;
   a nucleation layer directly on the silicon substrate, the nucleation layer including a material having a uniform composition ratio; and
   a buffer layer directly on the nucleation layer, the buffer layer including:
      a first layer including a nitride semiconductor material having a uniform composition ratio;
      a second layer, including a same material as the nucleation layer, directly on the first layer;
      a third layer, including a same material and a same composition ratio as the first layer, directly on the second layer;
      a fourth layer, including the same material as the nucleation layer, directly on the third layer; and
      a fifth layer, including the same material with the same composition ratio as the first layer, directly on the fourth layer;
   a nitride semiconductor layer directly on the fifth layer, wherein
   the first layer has a first lattice constant which is smaller than a lattice constant of the nitride semiconductor layer, the second layer has a second lattice constant which is same as a lattice constant of the nucleation layer, and the third layer has a third lattice constant which is same as the first lattice constant.

15. A method of manufacturing a semiconductor device, the method comprising:
   providing a silicon substrate;
   forming a nucleation layer including a material having a uniform composition ratio, directly on the silicon substrate;
   forming a buffer layer directly on the nucleation layer, in which the buffer layer comprises a first layer formed of a nitride semiconductor material having a uniform composition rate, a second layer formed of the same material as the nucleation layer directly on the first layer, and a third layer formed of the same material with the same composition ratio as the first layer directly on the second layer; and
   forming a nitride semiconductor layer directly on the third layer, wherein
   the first layer has a first lattice constant which is smaller than a lattice constant of the nitride semiconductor layer, the second layer has a second lattice constant which is equal to a lattice constant of the nucleation layer, and the third layer has a third lattice constant which is equal to the first lattice constant.

16. The method of claim 15, further comprising:
forming a device layer on the nitride semiconductor layer.

17. The method of claim 15, further comprising:
removing the silicon substrate.

18. The method of claim 17, wherein at least a portion of the nucleation layer and the buffer layer is removed together when the silicon substrate is removed.

19. The method of claim 18, further comprising:
forming a concave-convex pattern on a surface exposed by removal of the silicon substrate.

* * * * *